United States Patent [19]

Alford et al.

[11] Patent Number: 6,018,261

[45] Date of Patent: *Jan. 25, 2000

[54] METHOD AND APPARATUS FOR PROVIDING A LOW VOLTAGE LEVEL SHIFT

[75] Inventors: Ronald C. Alford; Frederick L. Martin, both of Plantation, Fla.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/801,665

[22] Filed: Feb. 18, 1997

Related U.S. Application Data

[63] Continuation-in-part of application No. 08/317,059, Oct. 3, 1994, abandoned.

[51] Int. Cl.$^7$ ...................................................... H03K 19/01
[52] U.S. Cl. .......................... 327/307; 327/312; 327/323; 327/65; 327/540
[58] Field of Search .................................. 327/307, 309, 327/312, 313, 315, 316, 323, 327, 328, 563, 65, 66, 83, 89, 538, 540, 541, 539, 543; 326/17

[56] References Cited

U.S. PATENT DOCUMENTS

| | | | |
|---|---|---|---|
| 3,991,323 | 11/1976 | Przybylski | 307/265 |
| 4,535,256 | 8/1985 | Reneau | 307/264 |
| 4,551,636 | 11/1985 | Andrews et al. | 307/264 |
| 4,551,642 | 11/1985 | Aizawa et al. | 307/552 |
| 5,015,888 | 5/1991 | Ovens | 307/475 |
| 5,175,451 | 12/1992 | Ihara | 307/530 |
| 5,283,479 | 2/1994 | Rosseel et al. | 307/446 |
| 5,391,981 | 2/1995 | Masson | 323/316 |
| 5,396,113 | 3/1995 | Park et al. | 327/543 |
| 5,397,935 | 3/1995 | Nitta et al. | 327/544 |

Primary Examiner—Timothy P. Callahan
Assistant Examiner—Eunja Shin
Attorney, Agent, or Firm—Frank M. Scutch, III

[57] ABSTRACT

A wideband level shift circuit (200) used with low voltage ECL or CML topologies includes a sub-Vbe voltage reference (201) whose output voltage is offset some fraction of a diode voltage drop below a supply voltage, where the fraction is held at a constant value as the diode voltage varies with temperature. A comparator circuit (203) is attached to the reference voltage circuit (201) as well as to a current sourcing transistor and differential buffer circuit (205). The comparator circuit (203) maintains the DC potential at the output of a current sourcing transistor so that the common-mode DC level of the output signal from a differential buffer is shifted down by a fraction of a diode drop from the common-mode DC level of a wideband AC input signal. The shift circuit (200) offers the advantages of a fraction of a diode DC voltage drop with little loss of AC signal bandwidth for circuits operating from low supply voltages.

12 Claims, 5 Drawing Sheets

METHOD AND APPARATUS FOR PROVIDING A LOW VOLTAGE LEVEL SHIFT

CROSS REFERENCE TO RELATED APPLICATIONS

This application is a Continuation in Part of Ser. No. 08/317,059, filed on Oct. 3, 1994, by Alford, Ronald, D. et al., entitled "Method and Apparatus for Providing a Low Voltage Level Shift" and assigned to Motorola, Inc, now abandoned.

TECHNICAL FIELD

This invention relates in general to voltage level shifting and more particularly to introducing a variable common-mode DC level offset for a wideband AC signal.

BACKGROUND OF THE INVENTION

Level shift circuits are necessary in digital circuits that belong to high-speed, differential logic families such as emitter coupled logic (ECL) or current mode logic (CML). These circuits provide a wideband solution for obtaining a full diode voltage (Vbe) drop in the common-mode direct current (DC) voltage level of alternating current (AC) input signals. A typical circuit that requires such a level shift circuit is an ECL latch such as that shown in prior art FIG. 1A. The ECL latch requires a differential AC clock input signals (CLK, CLKX) whose common-mode DC voltage must be shifted down from the common-mode DC voltage of the differential data input signals (D, DX) for proper circuit operation to occur. In particular, for the representative ECL latch shown in FIG. 1A, the base to collector junctions of devices connected to the clock inputs CLK and CLKX would be forward biased if the common-mode DC level of the differential clock input signals were not shifted down from the common-mode DC level of the data inputs D and DX. Thus, it becomes necessary to lower the common-mode DC level of the clock input signals CLK and CLKX to a low enough potential to avoid forward biasing the base to collector junctions of the current steering transistors. A variation of the problem where three bias levels are required is shown in FIG. 1B.

One typical circuit which has been extensively used to lower the common-mode DC level of an AC signal is the emitter follower circuit shown in prior art FIG. 2. This type of circuit has been developed to lower the common-mode DC voltage level of the clock input signals by an amount equal to a full base to emitter voltage drop for a given bias current. Since the common-mode DC level of the incoming clock signals at terminals INO and INOX is approximately at the supply voltage, the emitter follower circuit lowers the common-mode DC level of the clock signals at terminals Q1 and Q1X by a full diode drop below the supply voltage. By keeping the input resistance to the level shifting circuit low, the bandwidth of the input signal may be kept relatively constant.

An alternative configuration for obtaining a full diode drop level shift without limiting the input signal's AC bandwidth is shown in prior art FIG. 4. This approach uses the path through a high-speed differential buffer to maintain high output signal bandwidth. In this approach, a diode connected bipolar transistor is used to drop the differential buffer's supply voltage by a fill diode drop or by about 0.9 volts. Thus, the common-mode DC level of the output signals appearing at terminals CLK_OUT and CLK_OUTX is shifted down by a full diode drop from the input signals.

The problem with the full diode drop level shift circuits identified in FIG. 2 and FIG. 4 is that the present design environment for integrated circuits requires circuit operation in the presence of supply voltages as low as 1.8 volts DC for circuits with two DC bias levels such as the latch in FIG. 1A. A similar requirement is for circuits with three bias levels (such as the circuit in FIG. 1B) to operate at 2.7 volts. In a contemporary, small-geometry bipolar process, a base to emitter diode voltage drop is approximately 0.9 volts for active devices that are biased for high speed operation. When the supply voltage is lowered to 1.8 volts and the common-mode DC level of the clock input signals is shifted down by 0.9 volts through the use of the full diode drop level shift circuits illustrated in FIG. 2 or FIG. 4, the resulting common-mode DC level of the signals appearing at terminals CLK and CLKX of FIG. 1A is 0.9 volts below the 1.8 volt supply voltage, i.e. 0.9 volts. Again, since a base to emitter voltage drop is around 0.9 volts, the DC voltage level present at the emitters of devices Q2 and Q3 in FIG. 1A will be approximately zero volts.

Thus, the collector to emitter voltage of the current sinking transistor, Q1 in FIG. 1A, will also be approximately zero volts. In the presence of the required bias voltage of around 0.9 volts at the base of transistor Q1, the base to collector voltage of Q1 would be sufficiently high to forward bias this junction, and Q1 would be in saturation and would not act as a current sink. Therefore, it is not possible to operate digital circuits that belong to high-speed, differential logic families such as emitter coupled logic (ECL) or current mode logic (CML) with traditional full diode drop level shift circuits when operating with supply voltages as low as 1.8 volts. These circuits provide a wideband solution for coupling the outputs of CML logic circuits with the inputs to other logic circuits that require a different DC potential without changing the logic information present at the transmitting circuit output. Thus, the circuit in FIG. 1A illustrates the role of the level shift circuit in CML logic.

FIG. 1A can be treated as a transmitting circuit consisting of a pair of resistors R1 and R2 with equal value resistance. One terminal of each resistor is connected to a supply voltage (Vdd). The remaining terminals OUT and OUTX of the resistors are driven by a pair of linked bi-value currents I1 and I2. When I1 is at value I, I2 is at value 0. Conversely, if I2 is at value I, I1 is at value 0. In this way, a logic signal is defined between terminals OUT and OUTX of the circuit. Logic HIGH is defined when the voltage at terminal OUT is approximately equal to Vdd while the voltage at OUTX is approximately equal to Vdd-Vlogic, where Vlogic is the product of resistor value R and current value I. Logic LOW is defined when the voltage at terminal OUTX is approximately equal to Vdd while the voltage at OUT is approximately equal to Vdd-Vlogic. Typically Vlogic is defined with value sufficiently large to steer substantially all the current in a bipolar diffamp to one collector of the amplifier but small compared to a silicon diode voltage. A typical value is 150 millivolts (mV).

In FIG. 1B is a typical receiving circuit illustrating logic with three DC bias levels. The circuit consists of differential amplifiers (devices Q11 through Q16) stacked to form an AND gate. The output voltage is generated by drawing current through differential load resistors R3 and R4. The circuit is biased by source Q7 with fixed value I. Logic levels at the output are defined in the same manner as in the transmitting circuit. As seen in the figure, output terminal AND is at logic HIGH only when terminal A is at high potential compared to AX, B is at high potential compared to BX and C is at high potential compared to CX.

The need for level shifting the inputs to the receiving circuit is demonstrated by studying the DC voltage constraints at the inputs to the receiving circuit. If the transmitting circuit is coupled to terminals A and AX, acceptable performance can be achieved. If it is assumed that terminals A and AX are excited by a voltage between Vdd and Vdd-Vlogic, application of similar voltages to terminals B and BX results in saturation of devices Q13 and Q14. This results in slow or incorrect circuit operation. Clearly, the DC level of the voltages applied to terminals B and BX must be shifted down with respect to the voltages applied at A and AX by at least Vsat, the minimum voltage applied across a bipolar collector-emitter junction to keep that device from saturating. Similarly, the voltages at terminals C and CX must be below the voltages at B and BX by at least Vsat. At the same time, the logic definitions of the signals must be preserved. For these operations a level-shift circuit is needed.

As discussed above, the problem with the full diode drop level shift circuits identified in FIG. 2 and FIG. 4 is that the present design environment for integrated circuits requires supply voltages to be minimized. In a contemporary, small-geometry bipolar process, a base to emitter diode voltage drop is approximately 0.9 volts for active devices at room temperature that are biased for high speed operation. Using full diodes for level-shifts and assuming a Vsat of 0.4 volts, the minimum voltage Vdd applied required for correct circuit operation in FIG. 1B is 3.1 volts at room temperature. For a circuit with only two inputs (FIG. 1A) a supply voltage of 2.2 volts is required. To meet industry supply voltage standards, it is desirable to operate at voltages as low as 2.7 volts with 3 levels of logic and 1.8 volts with 2 levels of logic.

A solution to this problem is to create a level-shift circuit that produces a DC level shift that is a fraction of a diode drop. In that way, three-level logic could be supported by coupling an CML transmitting signal (FIG. 1A) directly to the A inputs of a receiver, through the fractional diode level shifter to the B inputs of the receiver and though a full-diode level shifter to the C inputs of the receiver. For two-level logic, only the A and B connections would be required.

A fractional-diode level-shift circuit would behave optimally if the level-shift voltage is set to ½ Vbe and maintained at that value over all operating temperatures. This can be seen by returning again to the receiving circuit in FIG. 1B. Assume that input pairs A, B and C are driven by 0, F and 1 diode level shifts, respectively, where F is a fraction between 0 and 1. If F is greater than 0.5, this moves transistors Q15 and Q16 closer to or into saturation. If F is less than 0.5, this moves transistors Q13 and Q14 closer to or into saturation. Maximum immunity to device saturation on both Q13, Q14 and Q15, Q16 is achieved when F is at 0.5. Since diode voltage Vbe is a function of temperature, the level shift voltage (F)(Vbe) should track in proportion to Vbe with temperature for optimal performance.

One way to avoid having to lower the clock input signal's common-mode DC voltage by the full 0.9 volt diode drop is shown in prior art FIG. 3. This circuit uses R1 and R2 to lower the common-mode DC level of the input signal by an arbitrary fraction of a base to emitter voltage drop. Resistors R1 and R2 form a voltage divider which sub-divides the voltage between the base and emitter of Q1'. Since the circuit produces a voltage drop that is some fraction of a full base to emitter voltage drop, it is referred to herein as a sub-Vbe level shifting circuit. When a 1.8 volt supply is used, dropping the voltage by less than 0.9 volts allows the latch in FIG. 1 to operate correctly. Annotated in FIG. 1A are DC bias voltages that would allow proper high-speed operation of this example ECL or CML latch. These DC bias voltages indicate that a half-diode drop level shift of 0.45 volts would allow proper circuit operation.

An inherent problem with the sub-Vbe circuit illustrated in FIG. 3 is a significant reduction in circuit speed and bandwidth due to the presence of a large time constant directly in the signal path. This occurs because resisters R1 and R2 must be made large enough not to sink substantial current from previous stages. This large resistance, together with the input capacitance of the level shifting transistors, forms a long time constant relative to the period of the incoming signals. An example of this scenario might be a contemporary IC process for which a minimum-sized NPN transistor's base transit time is 9.9 pS and for which the maximum transition frequency ($F_t$) has been found to occur at a collector bias current of 200 uA. In this situation and referring to FIG. 3, the base charging capacitance of Q1' would be approximately 75 fF and would dominate the maximum useful frequency of the device. Assuming that only 20 uA is to flow through R1 and R2 from the previous stage, then the values selected for R1 and R2 each will be about 33 K Ohms. With this value of resistance attached to the base terminal, the corner frequency would be only approximately 32 Mhz at the input of the sub-Vbe level shift circuit. This frequency response is not adequate for the present high frequency design environment around 3–4 GHz.

Therefore, the need exists for a circuit configuration for application as a DC level offset for wideband AC signals. The circuit should be applicable to future generations of land-mobile and cellular radios and capable of operating within a frequency range of up to 3–4 GHz with all components integrated on a single IC substrate. Traditional full diode drop level shifting circuits do not work with ECL and CML logic structures at low supply voltages. Thus, it would be desirable to have a circuit which would provide a fraction of a diode voltage drop DC voltage offset from a supply voltage or potential without limiting the bandwidth of the wideband signals. It would be further desirable if the fraction of a diode voltage drop could be maintained as a constant proportion of a diode voltage versus changes in temperature.

DETAILED DESCRIPTION OF THE PREFERRED EMBODIMENT

Figure 1A:
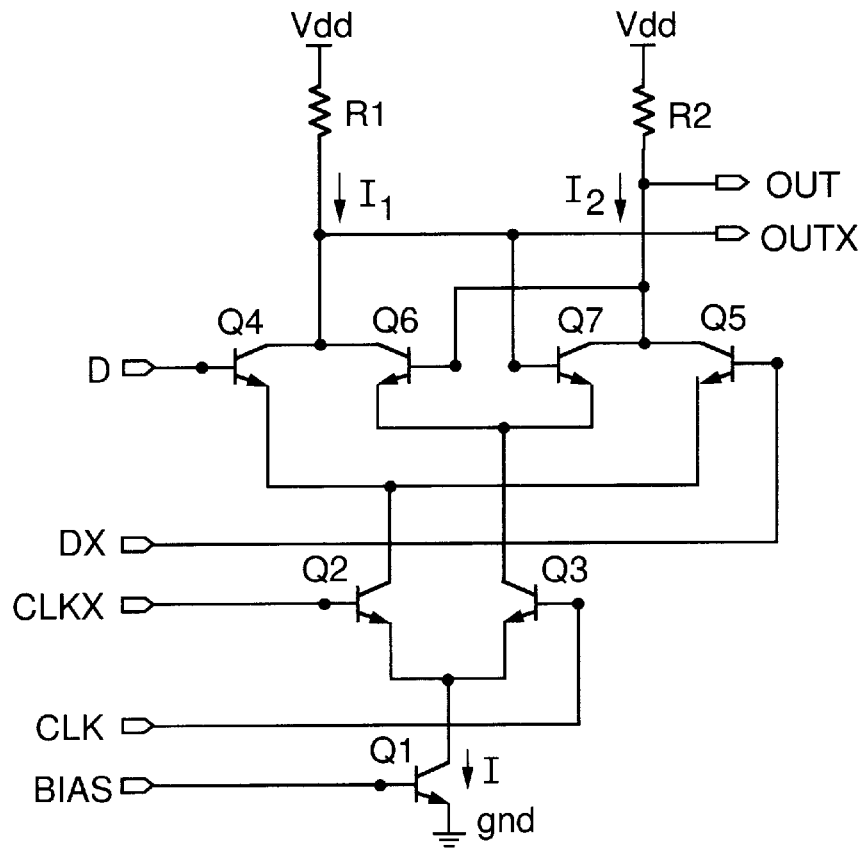
FIGS. 1A and 1B are prior art schematic diagrams showing an ECL or CML latchs used in transmitting and receiving circuits indicating the need for level-shirt circuits.
Figure 5:
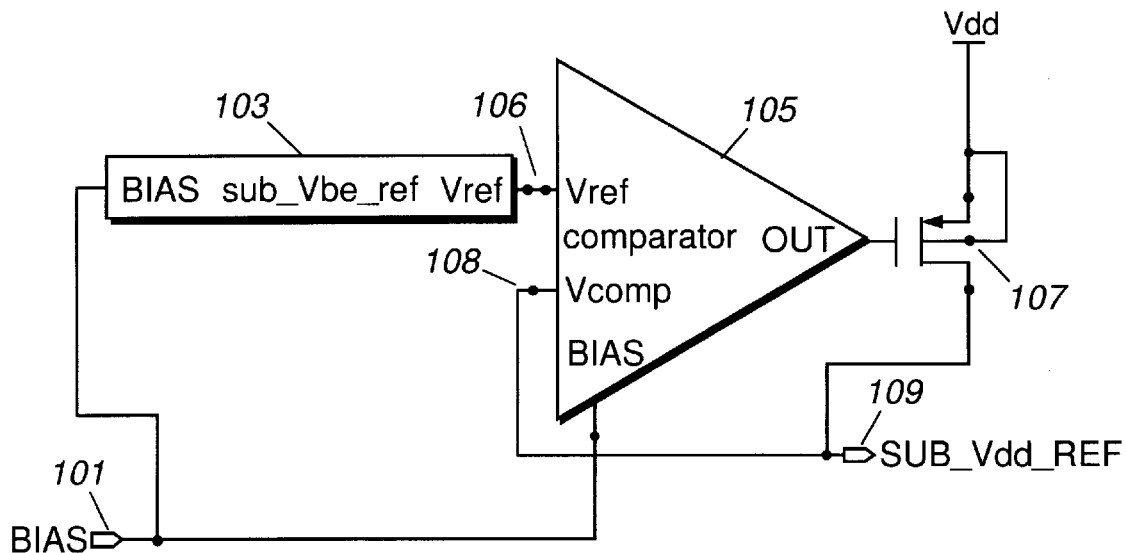
FIG. 5 is a block diagram of the preferred embodiment of the invention illustrating a sub-Vbe voltage reference circuit, comparator, and current sourcing transistor.

Referring now to FIG. 5, a block diagram illustrating the preferred embodiment of the sub-Vdd voltage offset circuit is shown generally at 100. This circuit 100 is generally used for transmitting a lock signal from a transmitting circuit to a receiving circuit. As in well known in the art, a "signal" may be defined by referring to FIG. 1A discussed herein.

To illustrate its operation, an input voltage or bias 101 is applied to bias sub-Vbe reference 103 and to bias a comparator circuit 105. The output of the sub-Vbe reference 103 is set to a voltage which is less than the supply voltage (Vdd) by some fraction of a diode voltage drop (Vbe). Typically, the supply voltage Vdd is approximately 1.8 volts. P-channel MOSFET transistor 107 is connected to the output of the comparator circuit 105 and sources current from supply voltage Vdd to a sub-Vdd reference point 109 and comparator input 108 to close a feedback control loop. Comparator 105 controls the gate to source voltage of transistor 107 such that the voltage at the sub-Vdd reference point 109 is held at approximately the same voltage as the output voltage of the sub-Vbe reference 103 over variations in load current drawn through transistor 107. The sub-Vbe circuit 100 operates by creating a voltage source whose output current and voltage appear at sub-Vdd reference point 109 and whose voltage is an arbitrary fraction of a diode voltage drop (Vbe) lower than the supply voltage Vdd.

Figure 2:
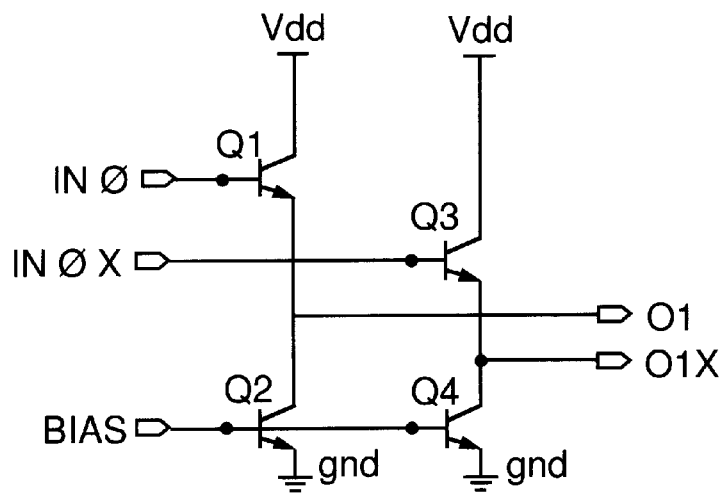
FIG. 2 is prior art schematic showing a traditional full diode drop level shift circuit for differential AC signals.
Figure 6:
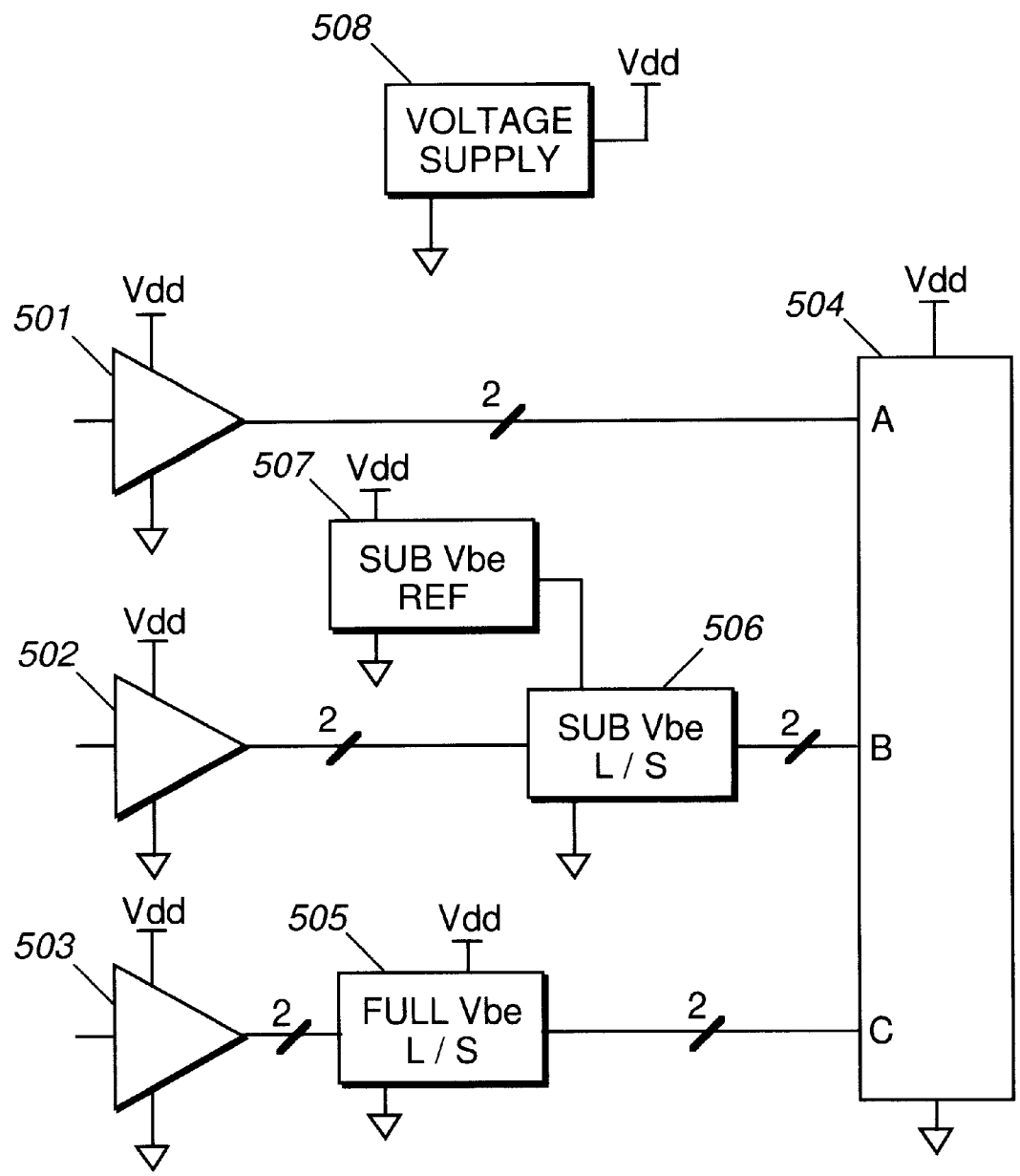
FIG. 6 is a block-level schematic illustrating the preferred embodiment of the invention showing reference voltage, comparator, current sourcing transistor, and differential ECL buffer circuits.

Referring now to FIG. 6, the block diagram illustrates a typical implementation of the invention utilizing a circuit for transferring radio frequency (RF) logic signals from transmitting circuits 501, 502 and 503 to a receiving circuit 504. Transmitting circuit 501 is coupled directly to port A of the receiving circuit. Transmitting circuit 503 is coupled to port C via a full diode level shift (L/S) circuit 505 of the type shown in FIG. 2. Transmitting circuit 502 is coupled to port B of the receiving circuit via a sub-Vbe level shift circuit (L/S) 506. Supply for sub-Vbe level shift circuit 506 is supplied via fractional-diode reference 507. Each of the above transmitting circuits 501, 502, 503, 504, 505 and 507 are supplied from supply 508 with a system supply voltage Vdd. Although this figure illustrates that the signal connections are differential, it will be evident to those skilled in the art, that single-ended variations are also possible.

Figure 3:
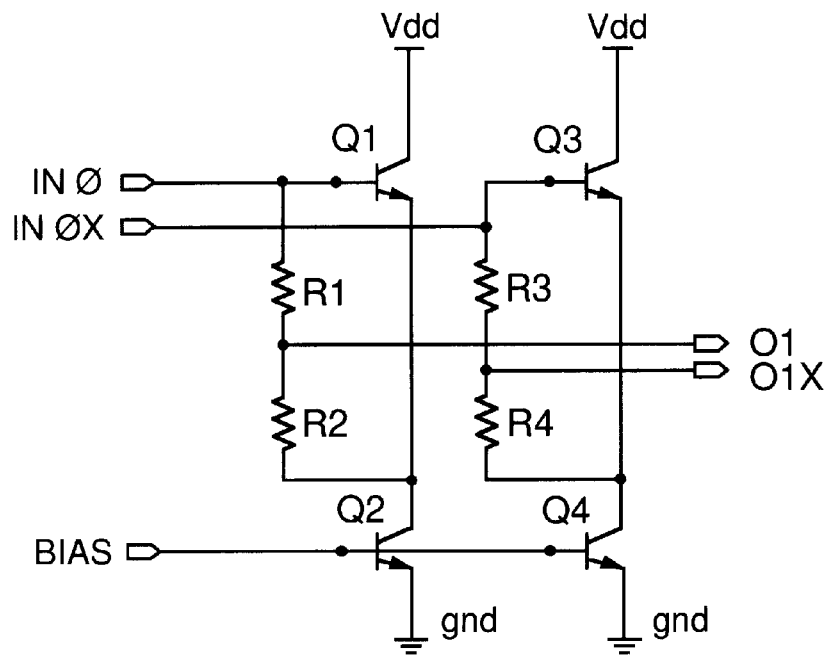
FIG. 3 is prior art schematic showing a traditional sub-Vbe level shift circuit.
Figure 4:
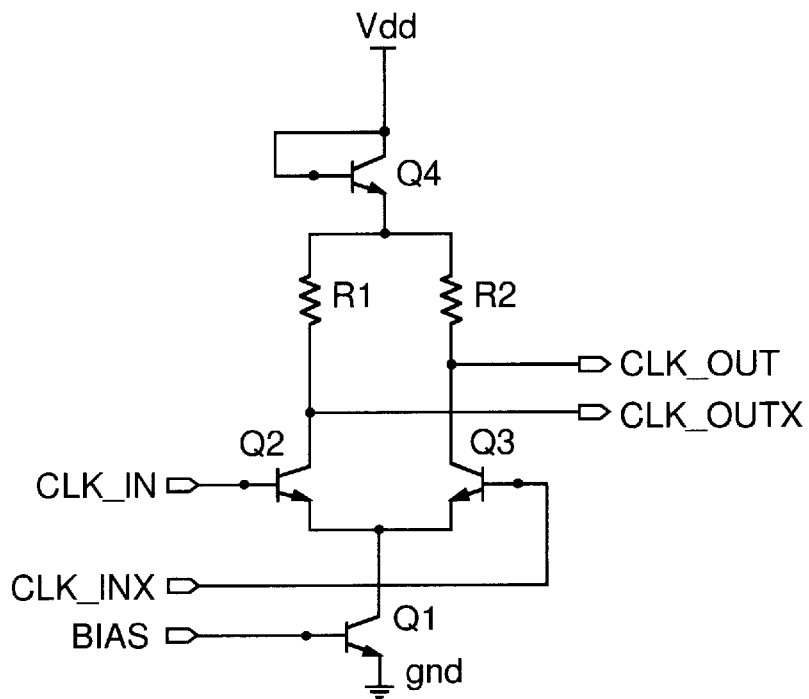
FIG. 4 is prior art schematic showing an alternative, wideband full diode drop level shift topology.

Applying the circuits shown in FIG. 6, a logic circuit with three separate bias levels is created. Using previously stated assumptions that Vbe is approximately 0.9 volts and Vsat is 0.4 volts, the logic circuit can operate at voltages as low as approximately 2.2 volts. This is a lower operating voltage than can be achieved using prior art broadband level-shift techniques like those shown in FIGS. 2 and 4. The lower operating voltage is achieved without the bandwidth limitations that would be present if the sub-Vbe level-shift circuit were replaced with the level-shift circuit of prior art FIG. 3. Because the sub-Vbe level-shift circuit tracks the diode voltage Vbe versus temperature, the level-shift function is optimized versus operating temperature. It will be evident to those skilled in the art that the circuit in FIG. 6 could be configured as a logic circuit with two bias levels. This would be accomplished by eliminating transmitting circuit 503 and the C port on receiving circuit 504. In this case, the minimum supply voltage could be reduced to below 1.8 volts.

Figure 7:
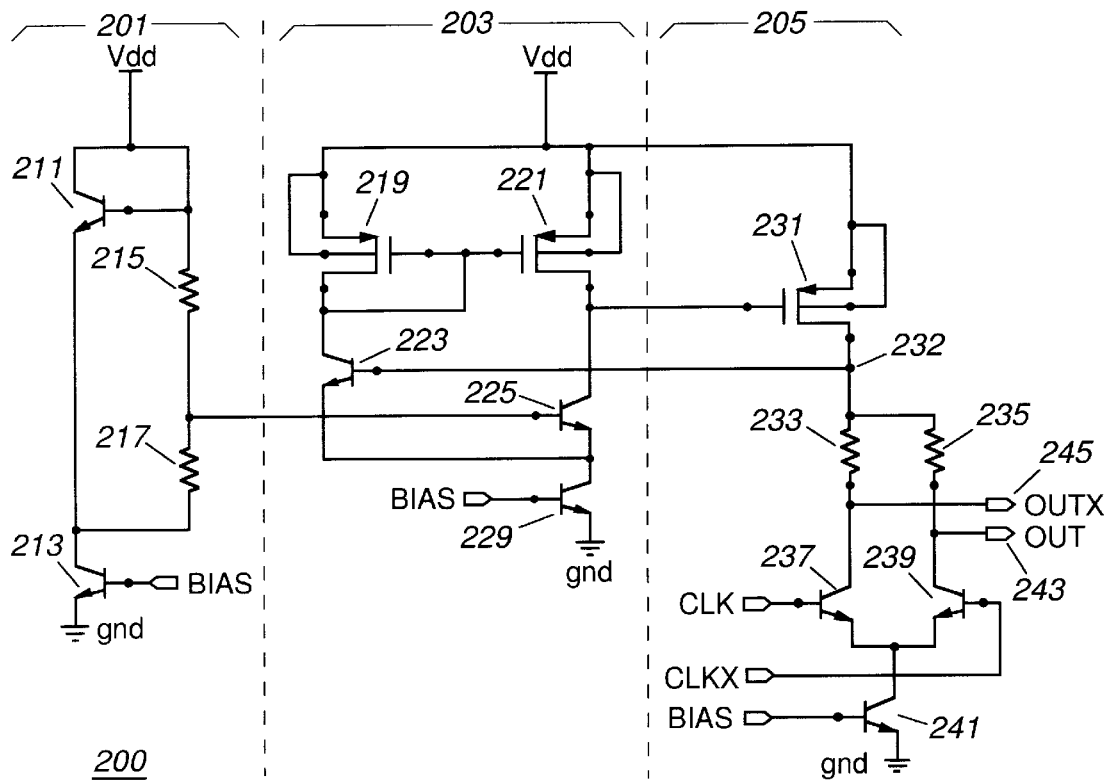
FIG. 7 is a device-level illustration of the preferred embodiment of the invention.

Referring to FIG. 7, a schematic view of the underlying circuits forming the block diagrams in FIG. 5 along with an additional differential ECL buffer is shown generally at 200. The wideband level shift circuit 200 is comprised of a sub-Vbe voltage reference offset circuit 201, comparator circuit 203 and a differential ECL buffer 205. The sub-Vbe voltage reference offset circuit 201 includes a diode-connected transistor 211 and current-sinking transistor 213. Resistors 215, 217 are attached to transistor 211, 213 as well as the voltage reference Vdd. Transistor 211 conducts the substantial majority of current that is being drawn by transistor 213. Transistor 211 functions to have a base to emitter voltage (Vbe) about 0.9 volts or one diode drop with a predetermined amount of bias current being drawn through transistor 211 by current sinking transistor 213. Transistor 211 essentially acts as a diode where Vbe is approximately 0.9 volts for the BICMOS 85 process.

Thus, as current is drawn through transistor 211, a specific voltage drop that is always very near 0.9 volts is developed in response to that current flow. Resistors 215, 217 act as a voltage divider and if set, for example, to equal values, the 0.9 volts voltage drop which occurs from the base to the emitter of transistor 211 will be 0.9/2 or 0.45 volts (one half of a diode drop). It will be evident to those skilled in the art, that the value of resistors 215,217 can be selected to provide any fraction of the 0.9 voltage drop produced by transistor 211. Thus, the sub-Vbe voltage reference offset circuit 201 produces a reference output voltage that is an arbitrary fraction of one diode drop less than the supply voltage Vdd.

Comparator circuit 203 is comprised of a current mirror which utilizes equally sized transistors 219, 221. Transistor 219 is the controlling side of the current mirror such that, to the first order, the amount of current that flows in transistor 219 must also flow in transistor 221. Disregarding Early voltage effects, this occurs since the gate to source voltage in transistor 219 is equal to that in transistor 221. Transistors 219, 221 are P-channel MOSFET's. These devices exhibit the characteristic that when a voltage of the correct polarity is present between the source terminal and the drain terminal and a potential greater than the threshold voltage is applied such that there is a lower potential on the gate terminal with respect to the source terminal, current will be conducted in proportion to the size of the potential difference between the gate and source terminals. The voltage reference formed at the junction of resistors 215, 217 is applied to the base of transistor 225.

By way of example, if the signal at the base of transistor 223 and transistor 225 were exactly equal, the same amount of current conducted through transistor 223 would be conducted through transistor 225 due to the equal currents required to flow in the current mirror formed by P-channel transistors 219, 221. That amount of current flowing through transistors 223, 219 and an equal amount flowing through transistors 225, 221 will be one half of the current which is being conducted through biasing transistor 229. Hence, there is a certain bias current flowing through biasing transistor 229, and if the input to signal at the bases of transistors 223 and 225 were equal, there would be the same amount of current flow in both sides of the comparator 203. If the base potential of transistor 225 established by the sub-Vbe voltage reference offset circuit 201 increases to a level greater than the base potential on transistor 223, the percentage of the bias current which is carried by transistor 225 will greatly increase and the fraction of the bias current flowing through transistor 223 will greatly decrease.

Similarly, the current flowing through transistor 219 will greatly increase. However, due to the presence of the current mirror with transistor 219 as its controlling side, the current through transistor 221 will remain equal to the current flowing through transistor 219. Thus, the collector of transistor 225 would like to draw substantially greater current than transistor 221 is allowed to supply. The net result is a drastic reduction in the potential at the collector of transistor 225. The reverse situation, in which the potential at the base of transistor 223 is made higher than the potential at the base of transistor 225 would have the net result of drastically increasing the potential at the collector of transistor 225.

Buffer circuit 205 is comprised of a current sourcing transistor 231, and a differential ECL buffer with bipolar input formed by resistors 233, 235 and transistors 237, 239 and 241. Resistors 233, 235 act as resistive loads while current sourcing transistor 231 is a P-channel MOSFET and transistor 241 is a current sinking bipolar bias transistor. The size of transistor 231 is variable depending on the amount of bias current being drawn by the differential ECL buffer. A negative feedback loop is created by connecting the drain of current sourcing transistor 231 to the base of transistor 223 in comparator 203 and by connecting the reference voltage supplied by the sub-Vbe reference circuit 201 to the base of transistor 225 also in comparator 203. The negative feedback loop and the comparator 203 act to keep the base voltage of transistor 225 equal to the base voltage of transistor 223. This allows a reference voltage to be set at the output of the sub-Vbe voltage reference circuit 201 and have an identical voltage appear at the drain of transistor 231 where this voltage is a fraction of a diode drop less than the supply voltage Vdd, which is typically 1.8 volts.

Finally, the current flowing in the ECL buffer drawn by the bias current transistor 241 will flow primarily either through transistor 237 or through transistor 239 and through their respective load resistors 233 or 235 under the switching action of the CLK and CLKX inputs. This establishes a differential output signal which will appear as a difference in potential between the OUT terminal 243 and the OUTX terminal 245. Differential CLK and CLKX input signals, with a common-mode voltage near the supply voltage Vdd, cycle above and below one another as they switch between conventional ECL logic states. The differential output voltage will also cycle between the two ECL logic states, but the common-mode voltage of the output signal will be shifted down by some fraction of a diode drop from the supply voltage Vdd. Therefore, the differential buffer has been utilized that will accept a high frequency signal at its input and output a high frequency signal as well, while creating fraction of a diode drop level shifts in the common-mode direct current (DC) level of the output signal.

Figure 8:
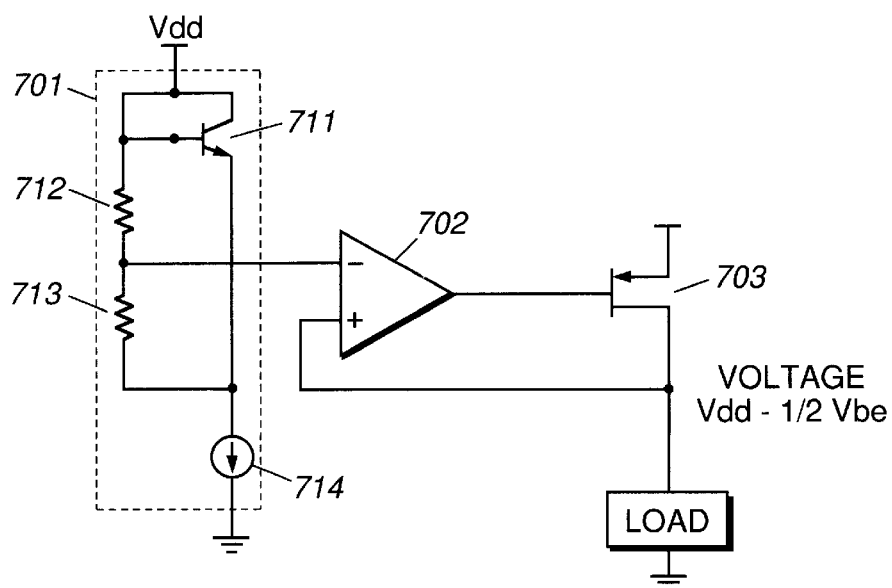
FIG. 8 is a device-level schematic of the sub-Vbe level shift circuit.

FIG. 8 shows a typical implementation of a sub-Vbe reference voltage generator. The generator consists of a voltage generating circuit 701, an amplifier gain stage 702 and output transistor 703. The reference voltage generator consists of a bipolar transistor 711, two resistors 712 and 713 and a current source 714 configured as a diode multiplier circuit. Supply to the circuit is provided by system supply Vdd. In operation, the base-emitter voltage of transistor 711 serves as a reference voltage for the circuit. The amplifier 702 and output transistor 703 form a buffer whose output voltage is independent of load current. The result is a voltage across the load that has a value equal to system supply voltage Vdd less some fraction of a diode voltage. As the diode voltage changes with temperature, the voltage of sub-Vbe reference voltage source 507 changes. As indicated herein, this temperature characteristic is needed to maximize the performance of the receiving circuit.

Figure 1B:
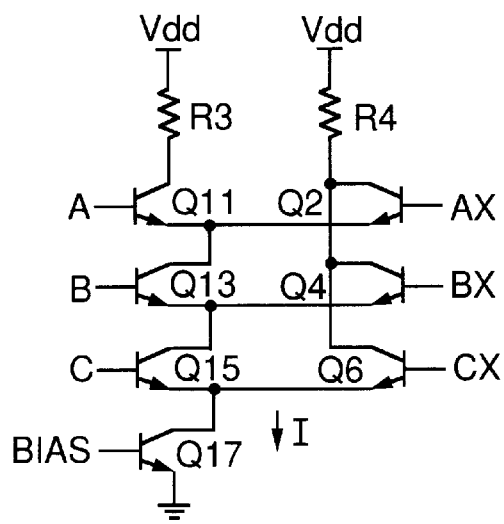

Furthermore, the optimal voltage from the level shift circuit is a value of ½ the voltage drop of a diode. It is known in the art that this can be produced by selecting resistors 712 and 713 at an approximately equal value and by setting the current through the resistors substantially small compared to the current in transistor 711. Current source 714 has value approximately equal to the current source values for the transmitting circuit (see FIG. 1A) the receiving circuits (FIG. 1B). This insures that the diode voltage in the circuits is similar such that the diode voltage is a logfunction of bias current.

In operation, a signal from transmitter circuit 501 is passed to port A of receiver circuit 504 without level shift. The signal from transmitter circuit 502 is passed to port B of 504 with a ½ diode level shift. The signal from transmitter port 503 is passed to receiver circuit 504 with a one diode level shift. The combination of the level-shift diff-amp 506 with sub-Vbe reference voltage source 507 produces a one-half diode level-shift that is maintained versus changes in temperature. This design allows for supply voltage to be minimized while the bandwidths of signal paths are maintained. As will be evident to a skilled artisan, the invention described herein is an improvement over existing art.

The preferred method of practicing the invention and utilizing the above described wideband level shift circuit 200 involves shifting from supply potential, which typically as low as 1.8 volts, the DC common-mode level of a wideband alternating current (AC) signal. The preferred method of shifting the DC component of a wideband AC signal below a supply voltage comprises the steps of accepting a wideband AC signal as an input signal and transforming the AC signal using a voltage reference, comparator, current sourcing transistor, and differential buffer into a wideband AC signal whose DC level is shifted down from supply potential by a predetermined portion of one diode voltage drop without excessively limiting the bandwidth of said input signal.

Specifically, this is accomplished by supplying or accepting a reference voltage used in establishing a predetermined fraction of a voltage drop below a supply potential. The voltage supplied by the reference voltage source is then buffered using a comparator circuit. A current sourcing transistor is biased with the output of the comparator circuit and the voltage potential at the output of the current sourcing transistor is maintained substantially equal to the reference voltage using a feedback loop during or in the presence of varying amounts of current flow. The wideband AC signal is then directed through a differential buffer for which current is supplied by the current sourcing transistor for lowering the DC common-mode level of the AC signal. Thus, the result is a DC level shift which is lowered some fraction of one diode drop less than supply reference voltage or potential. The fraction of one diode voltage drop remains at a constant value independent of the ambient temperature of the diode.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of shifting the direct current (DC) component of a wideband alternating current (AC) signal below a supply voltage comprising the steps of:

accepting a wideband AC signal voltage as an input signal;

transforming a DC level of the AC signal voltage by a fraction of a diode voltage drop across at least one forward biased diode at an ambient temperature; and wherein the fraction remains at a constant value independent of the ambient temperature of the at least one forward biased diode for minimizing the supply voltage of a semiconductor device.

2. A method as in claim 1 further wherein the AC signal is generated by a transmitting circuit that produces an AC output voltage with a DC level substantially at the supply voltage.

3. A method as in claim 1 further comprising the step of operating a receiving circuit with a DC component of the wideband AC signal biased below the supply voltage by a predetermined amount.

4. A method according to claim 1 wherein said supply voltage is approximately 1.8 volts.

5. A method according to claim 1 wherein said wideband AC signal is a differential signal.

6. A method according to claim 1 wherein said transforming step comprises the steps of:

supplying a voltage reference;

comparing the voltage reference to a feedback signal at a comparator;

sourcing current through a differential buffer;

applying a differential wideband AC signal to an input of the differential buffer; and receiving level shifted wideband AC signals at an output of the differential buffer.

7. A method of shifting from supply potential a direct current (DC) common-mode level of a wideband alternating current (AC) signal voltage comprising the steps of:

supplying a reference voltage from a voltage reference source for establishing a predetermined fraction of a temperature dependent voltage drop below a supply potential;

buffering the reference voltage supplied from said reference voltage source with a comparator;

biasing a current sourcing transistor with an output voltage of the comparator;

maintaining a voltage potential at the output of the current sourcing transistor substantially equal to the reference voltage with a feedback loop during varying amounts of current flow; and directing a wideband AC signal through a differential buffer for which current is supplied by the current sourcing transistor for lowering the DC common-mode level of the AC signal where the amount of the DC level shift is some fraction of one diode drop less than supply potential for minimizing the supply voltage of a semiconductor device.

8. A common-mode direct current (DC) level shift circuit for use with differential wideband alternating current (AC) signals used for providing a continuously programmable voltage offset up to a portion of a full diode voltage drop below supply voltage, the portion held at a constant proportion of a diode drop versus temperature, voltage comprising:

a voltage reference which establishes a reference voltage reduced in amplitude from that of a supply voltage;

a comparator for buffering the reference voltage supplied by said voltage reference and providing for a feedback control loop for maintaining the reference voltage with varying load currents;

a current sourcing transistor used to provide varying load currents: and a wideband differential buffer connected to said comparator and current sourcing transistor for providing a common-mode DC level shift for a wideband AC input signal for minimizing the supply voltage of a semiconductor device.

9. The DC level shift circuit of claim 8 wherein the current sourcing transistor is a P-channel MOSFET.

10. The DC level shift circuit of claim 8 wherein the voltage reference circuit is comprised of a current sinking transistor and voltage divider.

11. The DC level shift circuit of claim 8 wherein the comparator is comprised of differential NPN input devices and a P-channel current mirror.

12. The DC level shift circuit of claim 8 wherein the differential buffer includes a differential bipolar input with resistive loads.

* * * * *